(12) United States Patent
Ritter

(10) Patent No.: US 6,507,241 B1
(45) Date of Patent: Jan. 14, 2003

(54) METHOD AND CIRCUIT FOR AUTOMATICALLY CORRECTING OFFSET VOLTAGE

(75) Inventor: Mark B. Ritter, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 09/678,312

(22) Filed: Oct. 3, 2000

(51) Int. Cl.[7] .................................................. H03F 1/02

(52) U.S. Cl. ............................................. 330/9; 327/307

(58) Field of Search ................................ 327/307, 124; 330/9, 308, 11

(56) References Cited

U.S. PATENT DOCUMENTS 6,061,192 A * 5/2000 Ogiwara ................. 327/307 X

* cited by examiner

Primary Examiner—Steven J. Mottola
(74) Attorney, Agent, or Firm—Paul Otterstedt, Esq.; McGinn & Gibb, PLLC

(57) ABSTRACT

A circuit (and method) for correcting offset voltage in high-gain differential amplifier chains includes a detector element for detecting an offset voltage and a current mirror for generating an offset correction voltage. The circuit further has a current switch which outputs the offset correction voltage into the correct arm of the amplifier chain and a logic element which clocks the circuit, inputs a signal from the detector element and outputs a signal to the current switch.

26 Claims, 2 Drawing Sheets

METHOD AND CIRCUIT FOR AUTOMATICALLY CORRECTING OFFSET VOLTAGE

BACKGROUND OF THE INVENTION

1. Field of the Invention

The present invention generally relates to an electrical circuit, and more specifically, to an electrical circuit used to automatically correct offset voltages in high-gain differential amplifier chains and which is robust, inexpensive and requires no external measurement or correction programming.

2. Description of the Related Art

Communications receivers, like infrared (IR) wireless receivers or radiofrequency (RF) wireless receivers, often require high gain to amplify incoming signals to usable amplitudes. Such receivers typically use differential transceivers to suppress common-mode noise generated by other circuitry on the same integrated circuit (IC).

However, when the gain on the incoming signal is too high, device mismatch in the differential transceivers creates an offset voltage which is amplified along with the signal of interest. This offset voltage results in an error in determining the signal threshold at the analog-to-digital (A/D) converter and, if not corrected, will limit receiver sensitivity.

Transceivers may be produced without correcting offset voltage, in which case the transceivers will have to be examined after fabrication in a costly screening process to dispose of the modules which do not meet a required receiver sensitivity. However, it is more practical to design the transceiver so as to correct the offset voltage.

Correcting voltage offsets presents several concerns. For example, since voltage offsets typically vary with environmental factors (e.g., supply voltage and temperature), a separate screening program is required for each customer based on their application's environment. Further, the stresses induced on circuitry during packaging can cause piezoresistive changes in the components which can change the offset voltage. Therefore, such offsets cannot be corrected until after packaging.

There are several conventional methods used to correct voltage offsets. For instance, one traditional approach uses laser trimming of analog circuits. However, most modern digital complementary metal oxide semiconductor (CMOS) processes and analog BiCMOS processes cannot be laser trimmed because there are no laser trimmable resistors in the technology. In addition, laser trimming adds expense and is a one-time operation with no possibility of "dynamic" trimming of offsets for changes in environmental conditions.

Another method which is commonly used when a circuit is not laser trimmable (i.e., in the conventional sense of actually trimming a resistor on the die), uses laser fuses which can be blown to correct offsets. Unfortunately, this requires vastly greater die area and processing and, therefore, greater cost.

Another method corrects offsets by a feedback corrected offset cancellation circuit. However, continuous time feedback networks (which are all analog) introduce at least one more pole and zero in the amplifier circuit, and must be tested extensively to assure the offset cancellation does not produce oscillation of the circuit. Additionally, in some circuits, the frequency content of the data is so varied that it is not possible to use such a dynamic, analog, continuous-time feedback loop.

A common method of correcting offsets when signals are sampled at discrete time intervals is a switched capacitor offset cancellation technique. Here, during the sample and hold time, another clock phase is used to sample the offset and apply it to the amplifier input to correct it. Unfortunately, the charge on the capacitor which is used for offset correction slowly bleeds off due to inevitable leakage currents, and must be frequently refreshed. In addition, this technique does not work in applications having no continuous, well-controlled clock reference, or in applications such as communications links which cannot tolerate signal chopping.

More recently, off-chip component methods have been used to correct voltage offsets. For example, in the "DigiTrim" technique, an amplifier's offsets are canceled one time at wafer test level, then measured with an apparatus external to the circuit and corrected via external programming of the chip. Fuses are then blown to make the offset correction final.

Another off-chip component method is an electrically programmable analog-device (EPAD) technique which corrects offsets by a microprocessor which measures the offsets and applies suitable voltages to pins on the amplifier package.

Unfortunately, neither of these methods provides a self-contained, inexpensive offset correction which requires no external measurement and correction programming. Indeed, these techniques fail to address the need for offset correction in many analog applications which cannot be solved by feedback or chopper stabilization.

SUMMARY OF THE INVENTION

In view of the foregoing and other problems of the conventional systems and techniques, it is an object of the invention to provide a robust offset correction circuit which is inexpensive and requires no external measurement or correction programming.

In a first aspect, an offset correction circuit is provided which includes a detector element for detecting an offset voltage, a current switch, a current mirror for generating an offset correction voltage, and a logic element which inputs a signal from the detector element and outputs a signal to the current switch and current mirror. The logic element advances the counter of the circuit until the detector element changes state, at which point the offset voltage is corrected.

The logic element of the correction circuit may include a state machine for clocking the circuit, a control logic coupled to the state machine, and a counter coupled to the state machine and the control logic.

Further, the detector element of the correction circuit may include a comparator or an A/D converter. In addition, the offset correction current may be either internally generated by the current mirror or externally applied to the circuit.

In another aspect of the invention, a communications receiver is provided which has an amplifier chain coupled to an offset correction circuit as described above. The communications receiver may be an IR or RF wireless receiver, or any other communications circuit requiring high gain.

In another aspect of the invention, an operational amplifier is provided which has an amplifier chain coupled to an offset correction circuit as described above.

In a second embodiment of the invention, a method for correcting an offset voltage in an amplifier chain is provided which includes detecting the offset voltage, altering the offset voltage by using active devices connected to an input of the amplifier chain, and canceling the offset voltage by using a logic element to control the active devices until the offset voltage is substantially canceled.

These unique and unobvious features allow the claimed invention to correct offset voltages in high-gain differential amplifier chains in a manner which is robust, inexpensive and requires no external measurement or correction programming.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
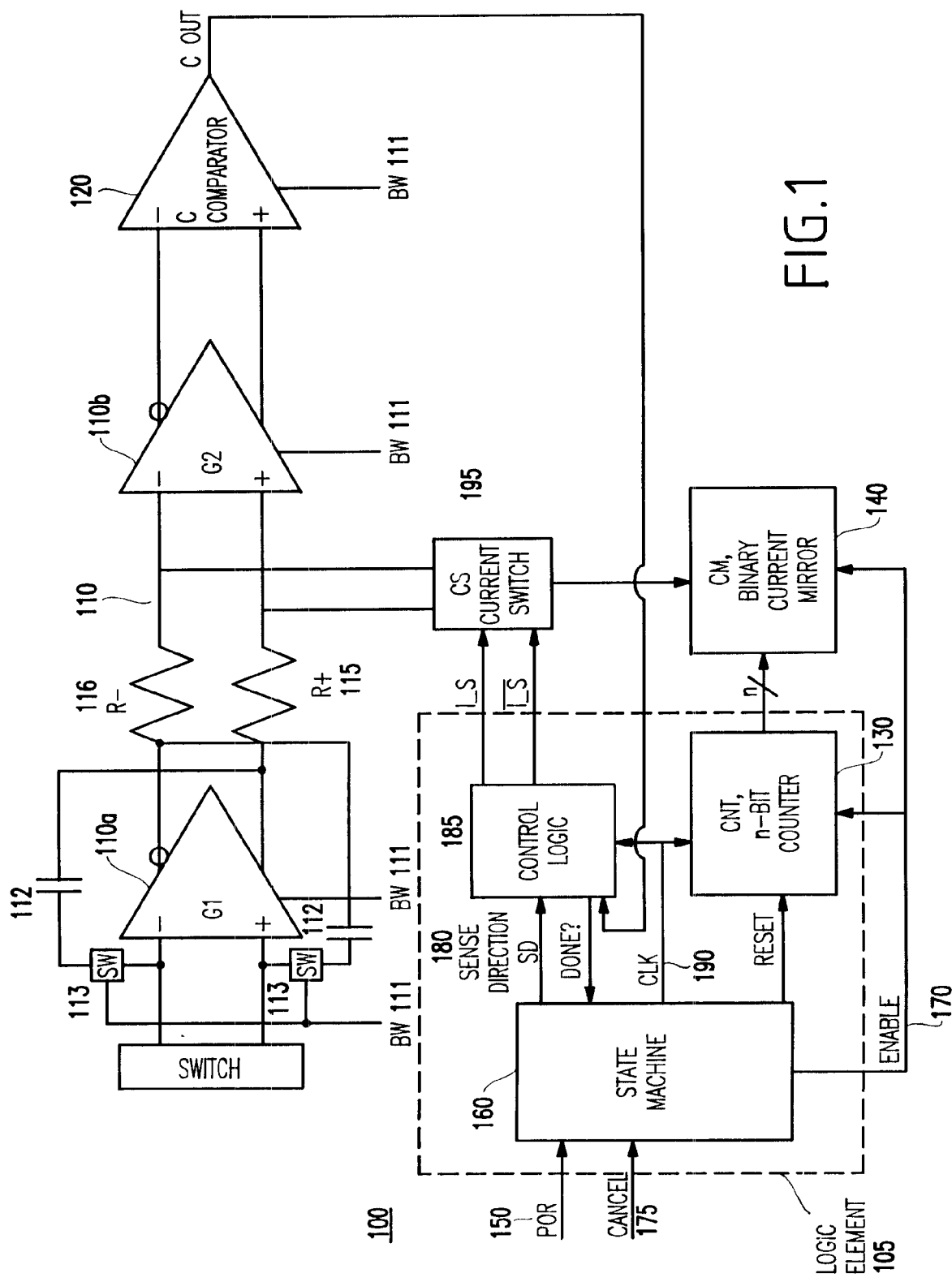
FIG. 1 schematically shows an automatic offset cancellation circuit 100 according to a first embodiment of the present invention.

Referring now to the drawings, FIG. 1 shows an offset cancellation circuit 100 according to a first embodiment of the present invention.

Generally, the offset correction circuit 100 according to the preferred embodiment includes a detector element (e.g., comparator 120) for detecting an offset voltage, a current switch 195, a current mirror 140 for generating an offset correction voltage, and a logic element 105. In the illustrative embodiment of FIG. 1, the offset correction circuit 100 is coupled to an amplifier chain 110 which includes a plurality of amplifiers G1 (110a), G2 (110b). Although the amplifier chain in FIG. 1 shows only two amplifiers it is clear to one of ordinary skill in the art that the amplifier chain may include any number of amplifiers.

Further, in FIG. 1, the detector element of the circuit is a comparator 120, although the detector element may also be an A/D converter. The comparator 120 is coupled to the output of the amplifier chain 110 and is used to sense the direction (or sign, positive or negative) of the offset voltage. In circuits such as fiberoptic or IR wireless receivers, the comparator 120 is simply the comparator normally used to quantify the analog input signal. In other circuits which would not normally include a comparator, such as operational amplifiers, the comparator would be part of the offset correction circuit and, if implemented by a CMOS, could be designed to cause negligible load on the final gain stage outputs.

The logic element 105 of the offset correction circuit 100 inputs a signal from the detector element (e.g., comparator 120) and outputs a signal to the current switch 195 and current mirror 140. In the illustrative embodiment shown in FIG. 1, the logic element includes a state machine 160 for clocking the circuit, a control logic 185 coupled to the state machine 160, and an n-bit counter 130 coupled to the state machine and the control logic.

The offset correction circuit of FIG. 1 corrects the device mismatch offset voltage seen at the comparator 120 by applying an offset correction voltage in the correct arm (line) of the amplifier chain 110. The offset correction voltage is generated by an n-bit weighted current mirror 140 which is controlled by an n-bit counter 130. The current mirror illustrated in FIG. 1 is a binary current mirror, although other current mirrors may be used as would be known to a person of ordinary skill in the art.

Specifically, the offset correction voltage is generated by pulling current generated by the current mirror 140 through a resistor which is in the receive chain. Together, the mirror 140 and counter 130 increase the offset correction voltage until the offset is cancelled.

The circuit is powered up by the following algorithm:

POR—a mixed-signal circuit which generates a pulse when on-chip voltage(s) reach a desired value. POR is used to reset the counter 130 and current mirror 140 and any fixed offset intentionally added in the receive chain to zero; may also disconnect inputs and/or reduce bandwidth to minimize noise.

WAIT—waits predetermined time for receive chain to settle; an RC timer can accomplish this task, or another form of clock.

SENSE DIRECTION—sense of detector element (e.g., comparator 120) output is measured; this determines which amplifier output, the + or the − output, is at a higher voltage COUNT—begin counting, and sample detector value after each count increment; increasing the count increases the current drawn through the binary current mirror 140.

STOP—stop counting when detector element (e.g., comparator 120) changes sense.

When power is applied to the circuit, a power-on-reset (POR) signal 150 is input to the state machine 160 which is used to clock the circuit. The POR signal 150 resets the count to zero, thereby shutting off the binary current mirror 140, and starts in motion the state machine 160 which, through resistor-capacitor (RC) generated time constants and digital logic, generates the sequence of clock signals necessary to control the circuit.

Figure 2:
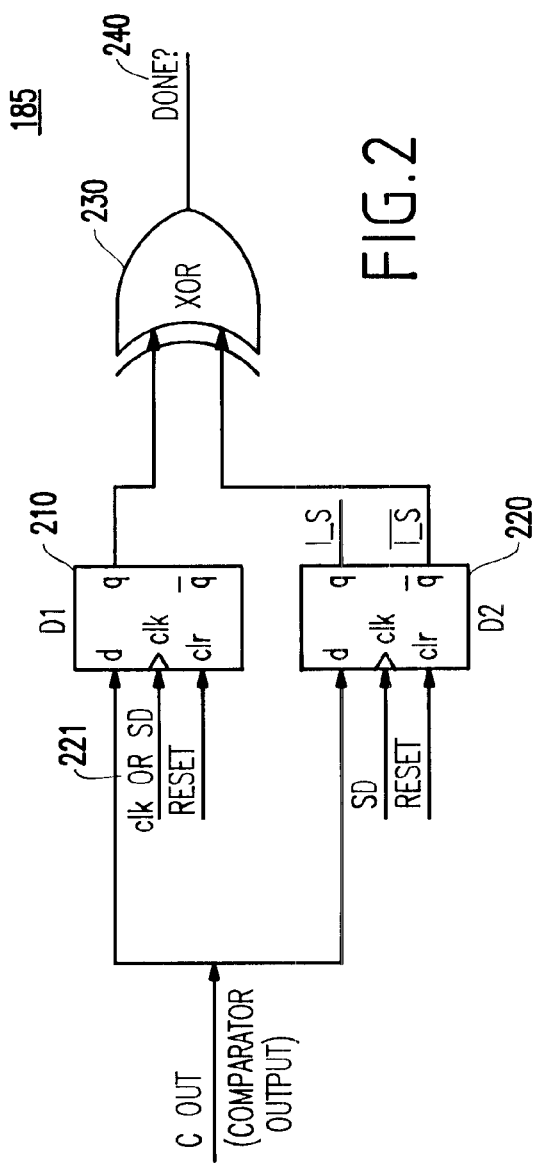
FIG. 2 is a detailed view of a control logic 185 of the automatic offset cancellation circuit 100 according to the first embodiment of the present invention.

The state machine 160 first generates an ENABLE signal 170 which turns on the binary current mirror 140 and enables the binary counter 130. It then generates a sense direction signal 180 which latches the state of the comparator 120 in first and second delay flip-flops 210, 220, as shown in FIG. 2.

Latch 220 holds the initial state of the comparator 120, and is used to choose the sign of the offset correction (i.e., if the + side of the amplifier chain is higher than the − side, current is drawn from a first correction resistor 115 and if the − side is higher than the + side, current is drawn from a second correction resistor 116). The initial comparator state in latch 220 is compared to the most recent state of the comparator after each increment of current through the binary current mirror 140 as the binary count is advanced; the most recent state is captured by latch 220.

Figure 3:
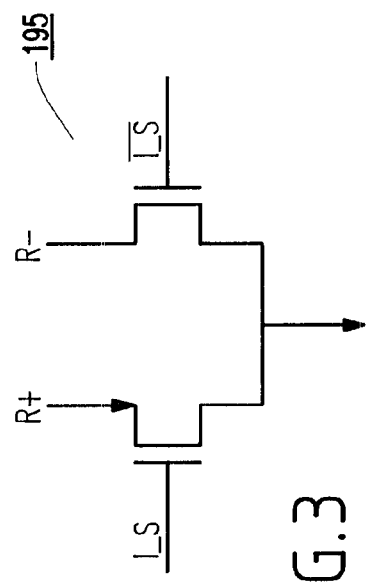
FIG. 3 is a detailed view of a current switch 195 of the automatic offset cancellation circuit 100 according to the first embodiment of the present invention.

Further, the binary current mirror 140 is coupled to a current switch 195 which has a differential NFET pair with I_S and (BAR)I_S, as illustrated in FIG. 3. The current switch 195 is coupled to the control logic 185 and assures that current is drawn from only one offset resistor, R− or R+, in the proper direction to reduce the voltage offset.

The state machine 160 further generates a clock 190 to the circuit. With each clock pulse the binary counter 130 is advanced, increasing the current drawn by the binary current mirror 140. The output of the comparator 120 is compared to the initial state as sampled by the sense direction signal 180 by comparing the state of a second delay flip-flop 220 which is clocked both by clock OR SD 221, to the state of a first delay flip-flop 210, which is clocked only by the initial sense direction pulse 180. The point at which the comparator 120 changes state is determined by comparing the output of the first delay flip-flop 210 with the inverted output of the second delay flip-flop 220 using an exclusive OR gate 230.

When the state of the comparator 120 changes, the output of the exclusive OR gate 230 goes high, and this signal disables further clocking to the binary current mirror 140 and raises the Done signal 240 to alert the state machine that offset correction has completed.

At this point, the count of the binary current mirror 140 is frozen during further operation of the circuit until the power of the chip is cycled on and off or until an intentional Cancel signal 175 is asserted, at which point the correction procees all over again by clearing the counter 130, reducing the chain bandwidth 111, disconnecting inputs, sensing the offset direction, and advancing the count until the offset is again corrected as described above.

If the Done signal 240 is not raised before the maximum count of the binary current mirror 140 is attained, the state machine 160 assumes an error exists and disables the circuit. This situation may occur, for example, when a defective part increases the offset voltage to a value too large to correct or when the initial state is sampled so near the noise band of the receiver that it samples the wrong comparator state (i.e., it is sampled on a noise pulse) in which case, the receiver did not need an offset correction.

Further, any amplifier chain involving high gain will experience some noise voltage due to the input amplifier or input source (e.g. a photodiode or an antenna). Such noise voltage is amplified in the amplifier chain and limits the degree to which offset voltage can be corrected. For example, if the offset voltage is 20 mV and the noise voltage is 10 mV, the offset voltage can only be corrected to 10 mV.

However, such noise voltage may be reduced by reducing the bandwidth of the amplifier chain. As shown in FIG. 1, this is accomplished in the preferred embodiment by using the POR signal to reduce the bandwidth 111 of the amplifiers 110a, 110b in the amplifier chain 110 and the comparator 120. To reduce the bandwidth, a device which does not affect the offset of the amplifier such as a Miller feedback capacitor 112 can be used as shown explicitly for amplifier G1. This provides an AC feedback path from the positive amplifier output to the negative input, and vice versa, in order to reduce the bandwidth, but, since there is no DC feedback path, the amplifier offsets are not affected. These Miller capacitors are switched into operation by a passgate switch 113 which is controlled by the bw signal 111 slowing the amplifier bandwidth only during the offset cancellation procedure.

The extent of correction may be further limited by the least significant bit (LSB) of the binary current mirror 140. That is, after the noise voltage is reduced, if the LSB of the current mirror 140 is greater than the reduced noise voltage seen at the comparator 120, the offset voltage may only be corrected to the extent of the LSB of the current mirror 140. To avoid this limitation, the circuit preferably includes a counter where the LSB correction is on the order of half of the rms noise voltage over the sampling interval. This will ensure that the circuit will count until the offset voltage at the comparator 120 is within the noise voltage of the amplifier chain 110 as seen at the comparator 120.

In addition, the circuit can be designed to provide an offset which is either independent of temperature and supply voltage, or to track the temperature and voltage dependence of the statistical offset. Furthermore, in critical circuits, the offset correction circuit can be re-run at any time during idle periods, and the on-chip state machine can assert a "correction complete" line to signal that the offset has been corrected.

Further, different initial conditions can be implemented in the offset correction circuit depending on the application. For example, instead of starting at a zero count state with no applied offset correction current, the circuit could start with an offset current generated by the current mirror at maximum count, then count down until the comparator changes state. In addition, the offset current could be fixed and the current drawn from the current mirror through the other resistor to reduce the offset between the two branches.

Furthermore, a circuit according to the present invention can be used in an operational amplifier or most other devices which require a large gain implemented in a number of stages. In that case, two or more offset correction circuits can be interspersed in the amplifier chain to eliminate offsets at various stages. Such a configuration would require that each offset correction be done separately (first one, then the next, etc). In circuits which have a number of parallel amplifier chains, an offset correction circuit could be inserted in each chain and the corrections performed in parallel with one state machine clocking all the correction circuits. At the end of the correction cycle, which would last only as long as one correction cycle, all of the parallel chains would be corrected with a local counter, holding the proper count to cancel the offset in that particular chain.

Figure 4:
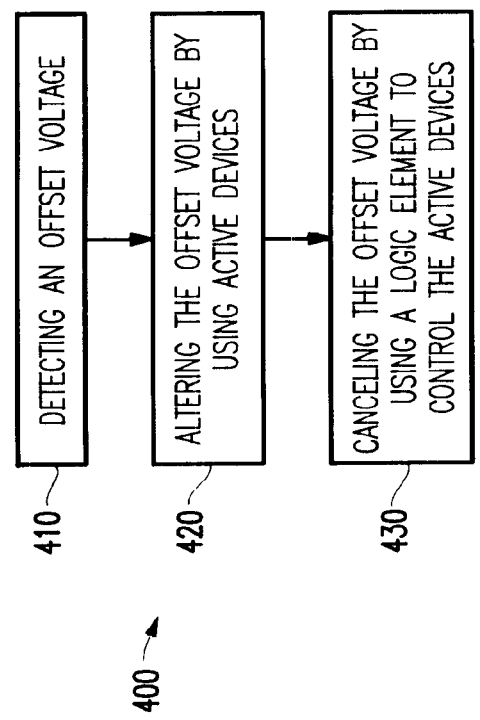
FIG. 4 is a flowchart illustrating a method for correcting an offset voltage in an amplifier chain according to a second embodiment of the present invention.

FIG. 4 illustrates a method for correcting an offset voltage in an amplifier chain 400 is provided according to a second embodiment of the present invention. The method 400 includes a first detecting step 410 of the offset voltage. As explained above, this may be performed by a detector element which includes a comparator or an analog-to-digital converter.

In step 420, the offset voltage is altered by using active devices connected to an input of the amplifier chain. As explained above, this may be formed by a current mirror which generates an offset correction voltage and a current switch for directing the offset correction voltage into the amplifier chain.

Finally, in step 430, the offset voltage is canceled by using a logic element to control the active devices until the offset voltage is substantially canceled. Also as explained above, the logic element may include a self-contained state machine along with a control logic and counter.

These unique and unobvious features allow the claimed invention to correct offset voltages in high-gain differential amplifier chains in a manner which is robust, inexpensive and requires no external measurement or correction programming.

While the invention has been described in terms of preferred embodiments, those skilled in the art will recognize that the invention can be practiced with modification within the spirit and scope of the appended claims.

What is claimed is:

1. A circuit for correcting an offset voltage in an amplifier chain, comprising:

a detector element for detecting said offset voltage in said amplifier chain;

a current switch coupled to said amplifier chain;

a current mirror coupled to said current switch, for generating an offset correction voltage; and a logic element receiving a signal representing said offset voltage from said detector element and outputting a first signal to said current switch and a second signal to said current mirror.

2. The circuit according to claim 1, wherein said logic element comprises:
   a state machine, for clocking said circuit;
   a control logic coupled to said state machine; and
   a counter coupled to said state machine and said control logic.

3. The circuit according to claim 1, wherein said current mirror comprises a binary current mirror.

4. The circuit according to claim 1, wherein said detector element comprises a comparator.

5. The circuit according to claim 1, wherein said detector element comprises an analog-to-digital converter.

6. The circuit according to claim 2, wherein said logic element advances a count of said counter until said detector element changes state and wherein said offset voltage is corrected when said detector element changes state.

7. The circuit according to claim 1, wherein a noise voltage of said amplifier chain is reduced by reducing a bandwidth of said amplifier chain and wherein said offset voltage is corrected to a level of the reduced noise voltage.

8. The circuit according to claim 1, wherein said offset correction voltage is independent of a temperature and a supply voltage.

9. The circuit according to claim 1, wherein said circuit tracks temperature and supply voltage dependence of said offset voltage.

10. The circuit according to claim 1, wherein an offset correction current is externally applied to said circuit.

11. The circuit according to claim 1, wherein an offset correction current is generated by said current mirror.

12. The circuit according to claim 1, further comprising:
    at least one feedback capacitor for reducing the bandwidth of said detector element and at least one amplifier in said amplifier chain.

13. A communications receiver having an amplifier chain, comprising:
    a circuit for correcting an offset voltage in said amplifier chain, said circuit comprising:
        a detector element for detecting said offset voltage in said amplifier chain;
        a current switch coupled to said amplifier chain;
        a current mirror coupled to said current switch, for generating an offset correction voltage; and
        a logic element receiving a signal representing said offset voltage from said detector element and outputting a first signal to said current switch and a second signal to said current mirror.

14. The communications receiver according to claim 13, wherein said logic element comprises:
    a state machine, for clocking said circuit;
    a control logic coupled to said state machine; and
    a counter coupled to said state machine and said control logic.

15. The communications receiver according to claim 13, wherein said detector element comprises a comparator.

16. The communications receiver according to claim 13, wherein said detector element comprises an analog-to-digital converter.

17. The communications receiver according to claim 13, wherein a noise voltage of said amplifier chain is reduced by reducing a bandwidth of said amplifier chain and wherein said offset voltage is corrected to the level of the reduced noise voltage.

18. The communications receiver according to claim 13, wherein said offset correction voltage is independent of temperature and supply voltage.

19. The communications receiver according to claim 13, wherein said circuit is used to track temperature and supply voltage dependence of said offset voltage.

20. The communications receiver according to claim 13, wherein an offset correction current is externally applied to said circuit.

21. The communications receiver according to claim 13, wherein said logic element advances the count until said detector element changes state and wherein said offset voltage has been corrected when said detector element changes state.

22. The communications receiver according to claim 13, wherein said circuit further comprises:
    at least one feedback capacitor for reducing the bandwidth of at least one amplifier in said amplifier chain and said comparator.

23. The communications receiver according to claim 13, wherein said communications receiver comprises a radiofrequency wireless receiver.

24. The communications receiver according to claim 13, wherein said receiver comprises an infrared wireless receiver.

25. An operational amplifier, comprising:
    an amplifier chain; and
    a circuit for correcting an offset voltage in said amplifier chain, said circuit comprising:
        a detector element for detecting said offset voltage in said amplifier chain;
        a current switch coupled to said amplifier chain;
        a current mirror coupled to said current switch, for generating an offset correction voltage; and
        a logic element receiving a signal representing said offset voltage from said detector element and outputting a first signal to said current switch and a second signal to said current mirror.

26. A method for correcting an offset voltage in an amplifier chain, comprising:
    detecting said offset voltage;
    altering said offset voltage by using a plurality of active devices connected to the amplifier chain, said plurality of active devices comprising a first active device and a second active device; and
    canceling said offset voltage by using a logic element to output a first signal to a first active device and a second signal to a second active device, so as to control said first and second active devices until said offset voltage is substantially canceled.

* * * * *